(12) United States Patent
Shah

(10) Patent No.: US 6,466,150 B1
(45) Date of Patent: Oct. 15, 2002

(54) POLAR ANALOG-TO-DIGITAL CONVERTER

(75) Inventor: Peter Jivan Shah, San Diego, CA (US)

(73) Assignee: Qualcomm, Inc., San Diego, CA (US)

( * ) Notice: Subject to any disclaimer, the term of this patent is extended or adjusted under 35 U.S.C. 154(b) by 0 days.

(21) Appl. No.: 09/696,901

(22) Filed: Oct. 25, 2000

(51) Int. Cl.⁷ ................................................. H03M 1/12
(52) U.S. Cl. ..................... 341/155; 375/308; 370/313
(58) Field of Search ............................ 341/155, 143, 341/141; 327/538, 318; 375/376, 324, 308; 455/423; 364/514; 323/315

(56) References Cited

U.S. PATENT DOCUMENTS

| | | | |
|---|---|---|---|
| 5,689,440 A | * 11/1997 | Leitch et al. ............... | 364/514 |
| 5,815,106 A | * 9/1998 | Poss et al. .................. | 341/159 |
| 5,854,813 A | * 12/1998 | Rottinghaus et al. ....... | 375/308 |
| 5,872,480 A | * 2/1999 | Huang ........................ | 375/324 |
| 5,923,203 A | * 7/1999 | Chen et al. ................. | 327/318 |
| 5,977,759 A | * 11/1999 | Sitch ......................... | 323/315 |
| 6,005,506 A | * 12/1999 | Bazarjani et al. ........... | 341/143 |
| 6,124,754 A | * 9/2000 | Afghahi ...................... | 327/538 |
| 6,141,394 A | * 10/2000 | Linebarger et al. ......... | 375/376 |
| 6,169,504 B1 | * 1/2001 | Park ........................... | 341/141 |
| 6,272,336 B1 | * 8/2001 | Appel et al. ................ | 455/423 |

* cited by examiner

*Primary Examiner*—Peguy JeanPierre
*Assistant Examiner*—Jean Bruner JeanGlaude
(74) *Attorney, Agent, or Firm*—Philip R. Wadsworth; Charles D. Brown; George C. Pappas

(57) ABSTRACT

A polar analog-to-digital converter ADC that can be advantageously used to extract phase and/or frequency information from a pair of input signals. The polar ADC includes first and second scaling elements, a number of comparators, and a decoder. The first scaling element receives and scales a first signal to provide a set of one or more scaled first signals. The second scaling element receives and scales a second signal to provide a set of one or more scaled second signals. Each of the comparators receives and compares a respective pair of scaled first and second signals and provides a comparison output. The decoder receives the comparison outputs from the comparators and generates output data, which can be indicative of the phase and/or frequency of the first and second signals.

27 Claims, 14 Drawing Sheets

POLAR ANALOG-TO-DIGITAL CONVERTER

BACKGROUND OF THE INVENTION

I. Field of the Invention

The present invention relates to electronic circuits. More particularly, the present invention relates to a novel and improved polar analog-to-digital converter (ADC).

II. Description of the Related Art

An analog-to-digital converter is an important component in many electronic circuits. An ADC converts a continuous analog signal into quantized samples at discrete time intervals. The samples are subsequently processed by other digital signal processing blocks to derive the desired data.

ADCs are commonly used in communication systems that employ various modulation schemes such as amplitude modulation (AM), frequency modulation (FM), and phase modulation (PM). As the names of these modulation schemes imply, the information is encoded in the amplitude, frequency, or phase of a carrier signal. The PM scheme includes several variants such as phase shift keying (PSK), binary PSK (BPQK), quadrature PSK (QPSK), offset QPSK (OQPK), m-ary PSK (m-PSK), and others. Other modulation schemes are also commonly used, such as quadrature amplitude modulation (QAM) which is a combination of the AM and PM schemes.

Phase and frequency modulations are employed in many digital communications systems, examples of which include code division multiple access (CDMA) communications systems, television transmission systems, broadcast systems, paging systems, and others. At a transmitter, data is processed, encoded, modulated using one of the modulation schemes noted above (e.g. FM or PM), and transmitted. At a receiver, the signal is received, conditioned, and demodulated into baseband signals (or possibly a low intermediate frequency (IF) signal) in a manner complementary to that used at the transmitter. The baseband signals typically include an inphase (I) signal and a quadrature (Q) signal. Conventionally, the I and Q signals are sampled with two ADCs to generate inphase and quadrature samples that are further processed to extract the phase or frequency information. Such processing may be accomplished with a look-up table, an angle calculation algorithm, or other techniques.

Many conventional receivers use two ADCs to sample the I and Q signals. The ADCs are typically designed with a (relatively) large number of bits of resolution to handle variations in the amplitude of the signals and to provide the accuracy required by the angle calculation algorithm. These high-resolution ADCs can be complex to design, costly to implement, and may further consume a large amount of power.

For many applications, since the information is embedded in the phase or frequency of a carrier signal, a "polar" ADC that provides phase information directly is highly desirable. It is also highly desirable that the polar ADC be simple to implement and consumes little power.

SUMMARY OF THE INVENTION

The present invention provides a polar analog-to-digital converter (ADC) that can be advantageously used to extract phase and/or frequency information from a pair of input signals. A typical I-Q plane is partitioned into M sectors by M/2 lines that intersect at the center of the I-Q plane. M/2 comparators are used to determine whether the input signals fall on one side or the other of each line. Simple decoding circuitry is then used to determine the phase of the input signal based on the comparison results from the comparators. The polar ADC can provide more accurate phase determination since scaled signals are compared, without quantization. Moreover, the polar ADC requires less circuitry to implement than a conventional linear ADC.

An embodiment of the invention provides a polar ADC that includes first and second scaling elements, a number of comparators, and a decoder. The first scaling element receives and scales a first signal to provide a set of one or more scaled first signals. The second scaling element receives and scales a second signal to provide a set of one or more scaled second signals. Each of the comparators receives and compares a respective pair of scaled first and second signals and provides a comparison output. The decoder receives the comparison outputs from the comparators and generates output data, which can be indicative of the phase and/or frequency of the first and second signals. The polar ADC can be advantageously implemented using C-MOS circuits that operate on differential current signals. In a specific implementation, each scaling element includes first through fourth current mirror circuits. The first current mirror circuit receives an input signal via a reference path and provides one or more scaled signals via a first set of mirror paths, where the input signal corresponds to either the first or second signal. The second current mirror circuit receives a complementary input signal via a reference path and provides one or more scaled signals via a second set of mirror paths. The third current mirror circuit receives, via a reference path, a scaled signal from one mirror path of the first current mirror circuit and provides one or more scaled signals via a third set of mirror paths. And the fourth current mirror circuit receives, via a reference path, a scaled signal from one mirror path of the second current mirror circuit and provides one or more scaled signals via a fourth set of mirror paths. The first and second sets of mirror paths provide sinking current, and the third and fourth sets of mirror paths provide sourcing current.

In a specific implementation, each comparator is implemented as a current comparator that receives a respective input current signal generated by combining current signals corresponding to selected ones of the scaled first and second signals. The current comparator can include first and second transistors and an inverter. The first and second transistors couple together at their sources and their bases. The inverter has an input coupled to the sources of the transistors and an output coupled to the gates of the transistors. The decoder can be implemented with a look-up table or combinatory logic.

Another embodiment of the invention provides a receiver that includes a front end unit, a demodulator, first and second filters, and a polar ADC. The front end unit receives a modulated signal and provides an intermediate signal. The demodulator receives and demodulates the intermediate signal with a set of inphase and quadrature carrier signals to generate demodulated inphase and quadrature signals, respectively. The first and second filters respectively receive and filter the demodulated inphase and quadrature signals to provide filtered inphase and quadrature signals. The polar ADC receives the filtered inphase and quadrature signals and generates output data. The polar ADC can be implemented as described above and can be configured to perform phase and/or frequency demodulation of the received signal.

Yet another embodiment of the invention provides a method for determining phase or frequency information in a received signal. In accordance with the method, a first signal and a second signal are received. Each of the received first and second signals is scaled with one or more scaling coefficients to generate a set of scaled signals. Pairs of scaled first and second signals are then generated, and the signals in each pair are compared to provide a comparison result. The comparison results for the pairs of scaled signals are decoded to generate output data. The scaling and pairing are dependent on the M/2 lines that define an M-sector polar ADC. For M equal sectors, the first and second signals can be scaled with scaling coefficients defined above.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1A:
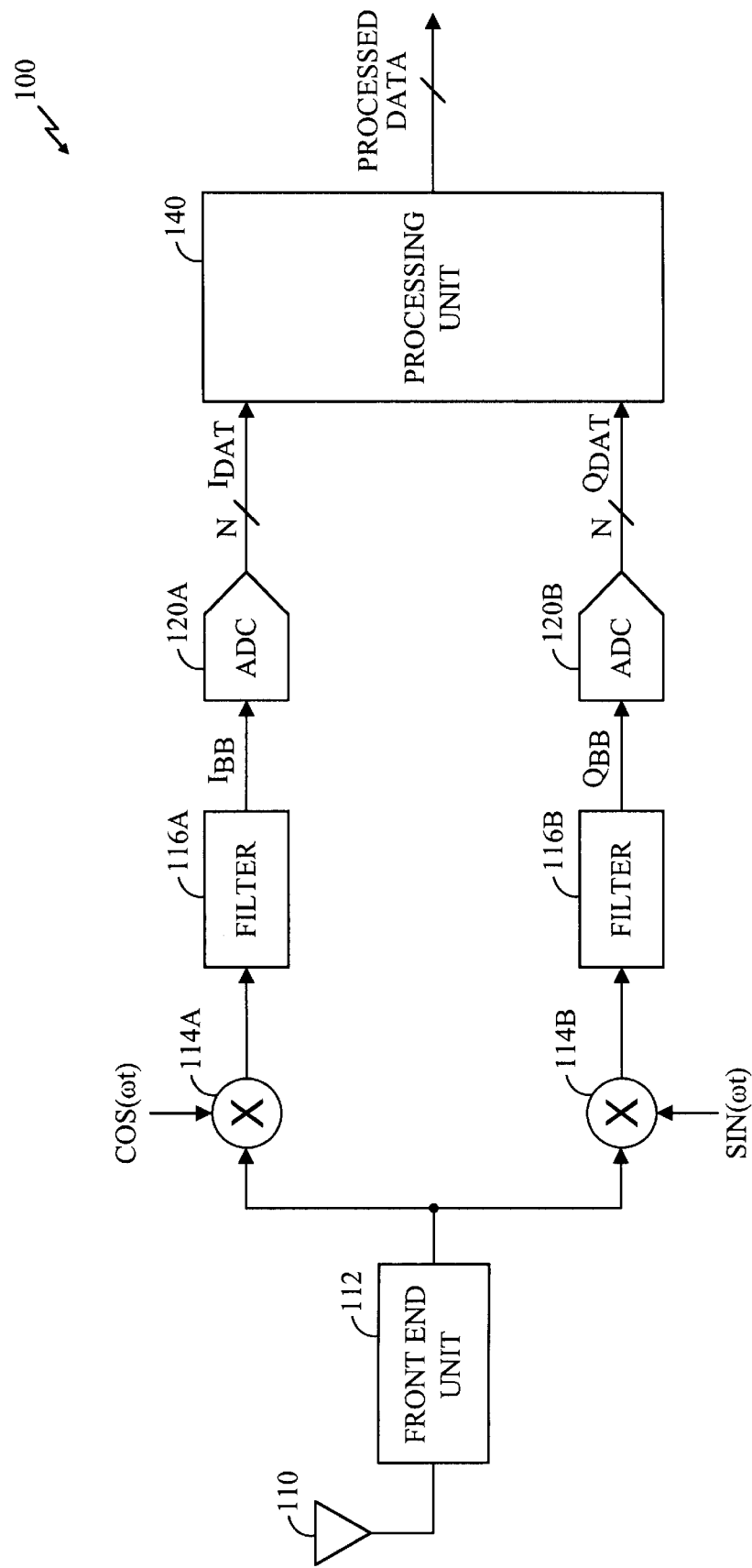
FIG. 1A shows a block diagram of a receiver that digitally demodulates a received signal with a pair of ADCs to extract phase and/or frequency information.

FIG. 1A shows a block diagram of a receiver 100 that digitally demodulates a received signal with a pair of ADCs to extract phase and/or frequency information. A modulated signal is received by an antenna 110 and provided to a front-end unit 112 that conditions the signal to generate an intermediate signal. The signal conditioning can include low-noise amplification, filtering, frequency conversion, and so on. The intermediate signal is provided to a pair of mixers 114a and 114b that downconvert the signal with an inphase carrier signal cos(ωt) and a quadrature carrier signal sin(ωt), respectively. The downconverted signals from mixers 114a and 114b are provided to filters 116a and 116b, respectively, that filter the signals to provide an inphase baseband ($I_{BB}$) signal and a quadrature baseband ($Q_{BB}$) signal, respectively. Filters 116 remove some spectral components such that these components do not alias in the subsequent sampling stage. Filters 116 are typically lowpass filter having a bandwidth matched, or related to, the bandwidth of the received signal.

The $I_{BB}$ and $Q_{BB}$ signals are respectively provided to ADCs 120a and 120b that sample and quantize the signals to generate inphase data ($I_{DAT}$) and quadrature data ($Q_{DAT}$). A processing unit 140 receives and processes the inphase and quadrature data to extract phase and/or frequency information, and provides the processed data. Processing unit 140 executes a phase (or frequency) computation algorithm that determines the phase or frequency of the I and Q data samples. Phase can be computed as the arc-tangent of the ratio of the Q sample over the I sample (i.e. phase=arctan ($Q_{DAT}/I_{DAT}$)) and frequency can be computed by differentiating the phase. In one design, for phase computation, processing unit 140 includes a look-up table that stores a set of arc-tangent values. The I and Q data samples would then be provided as inputs to, and used to index, the look-up table. Processing unit 140 can further be designed to perform other functions, such as decoding, decompression, and so on. Receiver 100 can be used to demodulate a signal that has been modulated using one of numerous phase and frequency modulation formats, including FM, PSK, BPSK, QPSK, OQPSK, QAM, and others.

Receiver 100 includes several disadvantages. First, since the I and Q baseband signals are digitized independently, mismatch in the I and Q signal paths (e.g. mismatch in ADCs 120a and 120b) causes error in the detected phase, or the angle of an I and Q sample pair. Second, a (relatively) large number of bits is typically required for ADCs 120 even for modest angle accuracy. This requirement stems from the fact that the angle is computed digitally from the quantized data samples and because of normal variations in the amplitude of the baseband signals. The ADCs are typically designed to provide a sufficient number of bits (N1) for the angle calculation at the minimum I and Q signal amplitude and to provide a sufficient number of bits (N2) to accommodate the maximum signal amplitude. Thus, the total number of bits required is approximately N1+N2.

Figure 1B:
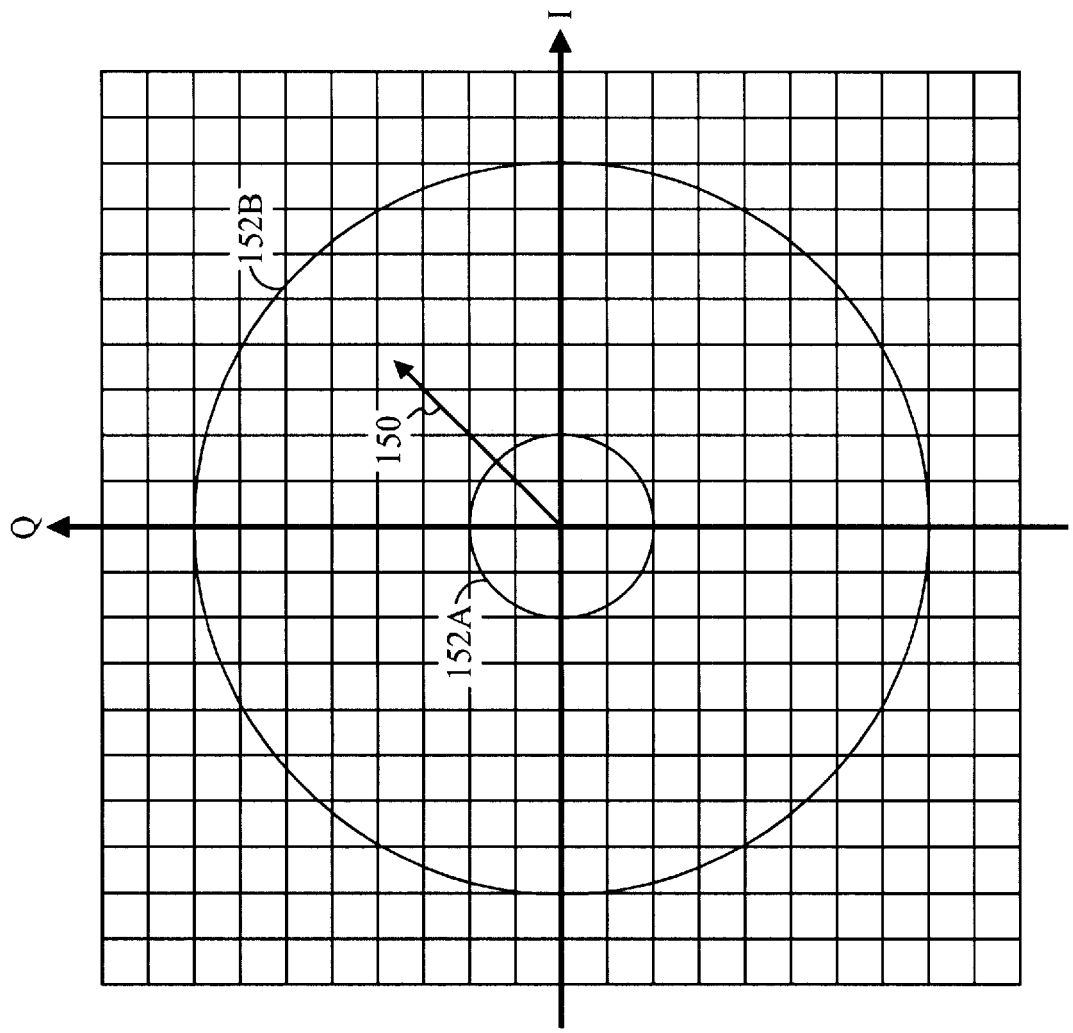
FIG. 1B is a diagram that illustrates the quantization of the I and Q signals with conventional ADCs.
Figure 2:
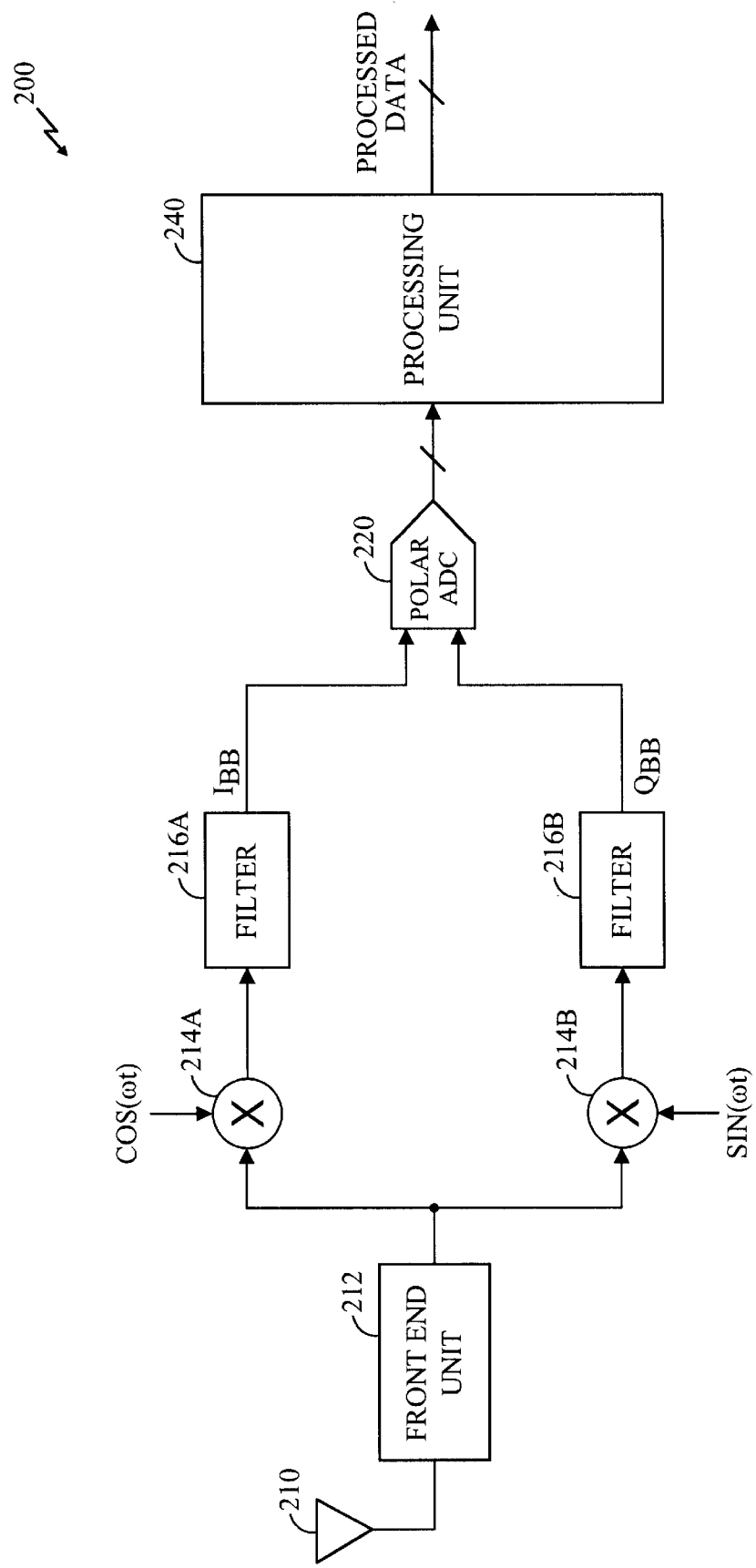
FIG. 2 shows a block diagram of a receiver that digitally demodulates a received signal with a polar ADC to extract phase and/or frequency information.

FIG. 1B is a diagram that illustrates the quantization of the I and Q signals with conventional ADCs. The I and Q signals can be represented as a phasor (e.g., phasor 150) that can fall anywhere on the I/Q plane and is quantized to one of the points on the grid. Circle 152a represent small-amplitude I and Q signals and circle 152b represents large-amplitude I and Q signals. As can be seen from this diagram, the angle determination becomes much more imprecise for small amplitudes as opposed to large amplitudes. FIG. 2 shows a block diagram of a receiver 200 that digitally demodulates a received signal with a polar ADC to extract phase and/or frequency information. A modulated signal is received by an antenna 210, conditioned by a front-end unit 212, and downconverted by a pair of mixers 214a and 214b with an inphase carrier signal Cos(ωt) and a quadrature carrier signal sin(ωt), respectively. The downconverted signals from mixers 214a and 214b are filtered by filters 216a and 216b, respectively, and the resultant I and Q baseband signals are provided to a polar ADC 220. Polar ADC 220 samples the baseband signals and generates data indicative of the phase and/or frequency of the received signal.

A decoder 240 receives and processes the data and provides the processed data. In some embodiments, polar ADC 220 can be designed to also quantize the baseband signals to provide amplitude information. Elements 210, 212, 214, and 216 can be implemented similar to elements 110, 112, 114, and 116, respectively, in FIG. 1A. Polar ADC 220 performs the data sampling function performed by ADCs 120a and 120b in FIG. 1A. Polar ADC 220 (possibly with the assistance of processing unit 240) also performs the phase and/or frequency determination function performed by ADCs 120 and processing unit 140 in FIG. 1A. Again, receiver 200 can be used to demodulate a signal that has been modulated using one of numerous phase and frequency modulation formats.

Figure 3:
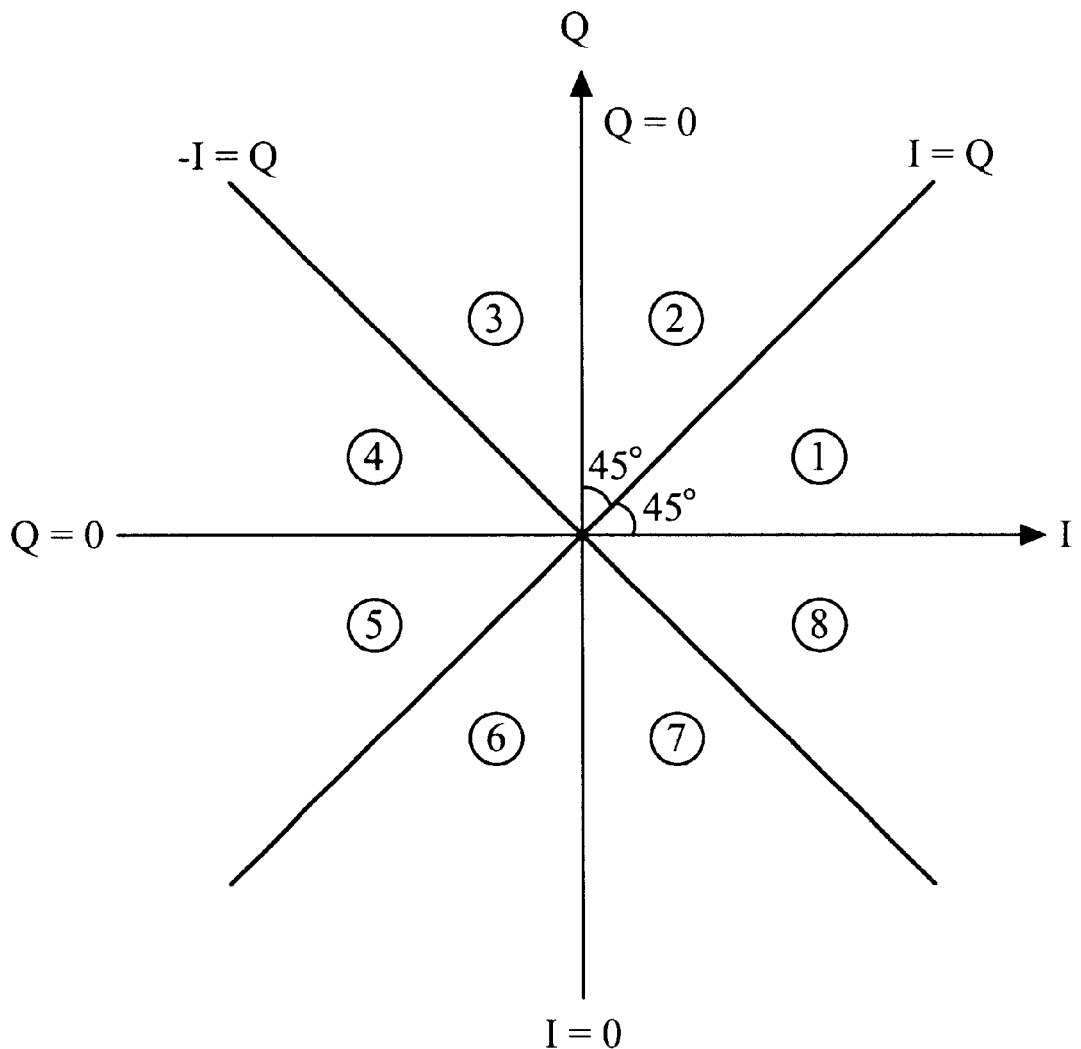
FIG. 3 shows a diagram of an I-Q plane for an 8-sector polar ADC.

FIG. 3 shows a diagram of an I-Q plane that is partitioned into eight wedge-shaped sectors. The I-Q plane is defined by a horizontal I axis and a vertical Q axis, and is partitioned into eight 45° sectors that are labeled with numerals 1 through 8. These eight sectors are generated by the intersection of four lines, which are in turn defined by the four equations: I=0, Q=0, I=Q and −I=Q. For each pair of I and Q samples (i.e. each I/Q sample pair), the polar ADC determines which one of the eight sectors the sample pair falls into. The 8-sector polar ADC is able to resolve the phase of an I/Q sample pair to within ±22.50° of accuracy.

Figure 4A:
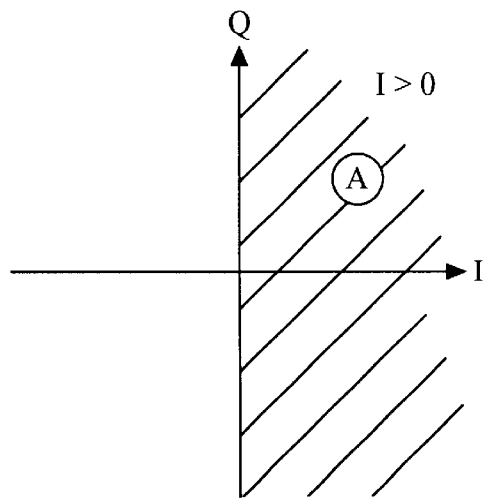
FIGS. 4A through 4D show diagrams of the I-Q planes for four different comparison tests for the 8-sector polar ADC.
Figure 4B:
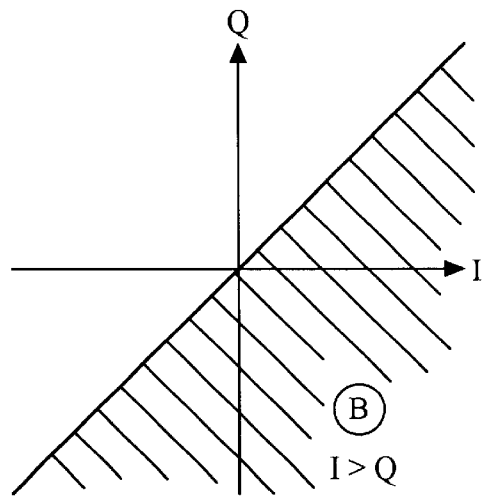
Figure 4C:
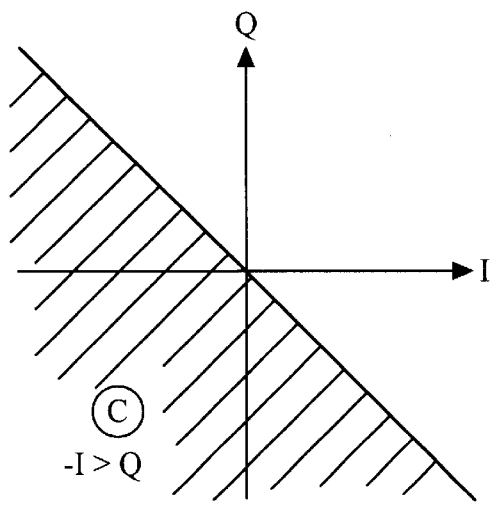
Figure 4D:
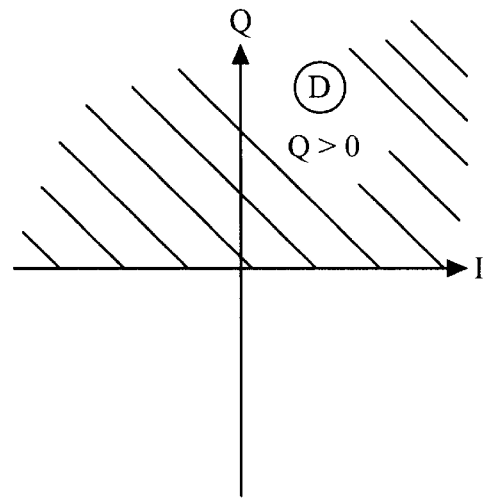

FIGS. 4A through 4D show diagrams of the I-Q planes for four different comparison tests based on the four lines described above. As shown in FIG. 3, the eight sectors are defined by four lines, and each sector can be identified based on the results of the four comparison tests corresponding to the four lines. FIG. 4A shows the I-Q plane divided into two regions defined by the line I=0. The hashed area to the right of the line corresponds to region A where the I sample is greater than zero. FIG. 4B shows the I-Q plane divided into two regions defined by the line I=Q. The hashed area below the line corresponds to region B where the I sample is greater than the Q sample. FIG. 4C shows the I-Q plane divided into two regions defined by the line −I=Q. The hashed area below the line corresponds to region C where the inverted I sample (i.e. −I) is greater than the Q sample. And FIG. 4D shows the I-Q plane divided into two regions defined by the line Q=0. The hashed area above the line corresponds to region D where the Q sample is greater than zero. Again, the particular sector that an I/Q sample pair falls in can be determined based on whether the I/Q sample pair falls into regions A, B, C, and D.

Figure 5:
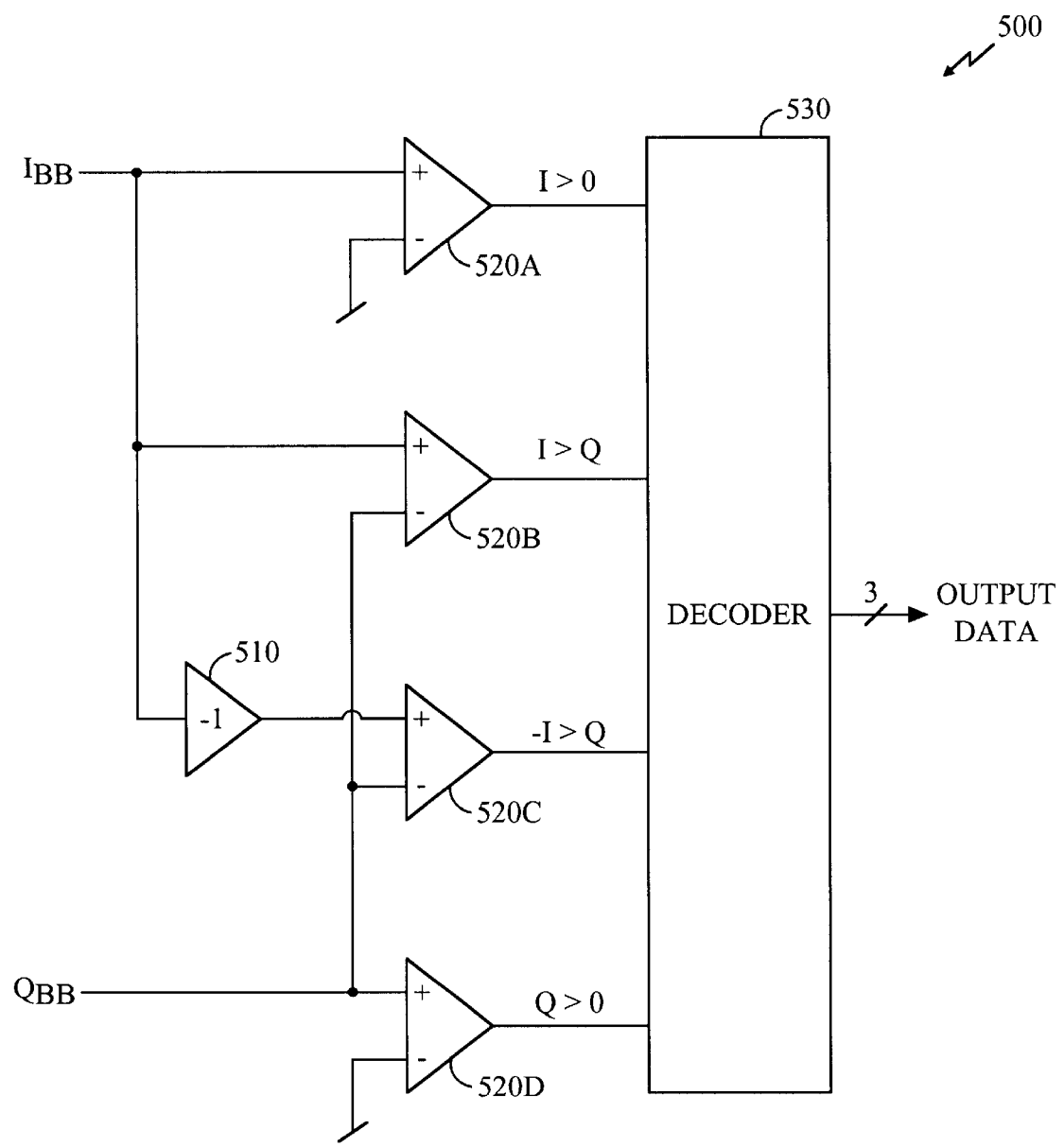
FIG. 5 shows a block diagram of an embodiment of an 8-sector polar ADC.

FIG. 5 shows a block diagram of an embodiment of an 8-sector polar ADC 500. The I baseband ($I_{BB}$) signal is provided to the non-inverting inputs of comparators 520a and 520b and to the input of a scaling elements 510. The Q baseband ($Q_{BB}$) signal is provided to the inverting inputs of comparators 520b and 520c and to the non-inverting input of a comparator 520d. The inverting inputs of comparators 520a and 520d are coupled to a "zero" reference level (i.e. the mid-scale level of the $I_{BB}$ and $Q_{BB}$ signals). Comparator 520a performs the test for FIG. 4A, i.e., whether the I signal is greater than zero. Comparator 520b performs the test for FIG. 4B, i.e., whether the I signal is greater than the Q signal. Comparator 520c performs the test for FIG. 4C, i.e., whether the inverted I signal is greater than the Q signal. And comparator 520d performs the test for FIG. 4D, i.e., whether the Q signal is greater than zero.

In FIG. 5, the I and Q baseband signals may be continuous signals or sampled signals. The sampling may be performed by a sampling circuit preceding polar ADC 500 (not shown in FIG. 5). Alternatively, the sampling can be performed by comparators 520a through 520d based on a sampling clock (also not shown in FIG. 5). The outputs from comparators 520a through 520d comprise the intermediate data that is provided to a decoder 530. Decoder 530 determines the phase (or angle) of each I/Q sample pair and provides the output data. Decoder 530 can also be designed to extract frequency and/or amplitude information associated with the I/Q sample pair, as described below. For an 8-sector polar ADC, 3-bit are used to identify a particular one of the eight sectors corresponding to each I/Q sample pair.

Referring back to FIGS. 4A through 4D, which illustrate the four comparison tests for the 8-sector polar ADC, the phase of the I/Q sample pair can be determined from the comparison results from comparators 520a through 520d. If the output from a comparator (e.g., comparator 520a) is high, the I/Q sample pair falls in the hashed region of the corresponding I-Q plane (i.e., region A). Each sector is defined by the combination of the results from the four tests. For example, the I/Q sample pair falls in sector 1 if the following conditions are true: (1) the output from comparator 520a is high, indicating I>0, (2) the output from comparator 520b is high, indicating I>Q, (3) the output from comparator 520c is low, indicating −I<Q, and (4) the output from comparator 520d is high, indicating Q>0. Sector 1 is thus defined as the union of the hashed regions in FIGS. 4A, 4B, and 4D and the unhashed region in FIG. 4C.

Table 1 lists the eight sectors in the I-Q plane of FIG. 3 and the associated outputs from comparators 520a through 520d. Comparators 520a through 520d determine whether the I/Q sample pair falls into to regions A through D, respectively. A "1" table entry indicates a high output from the comparator, and that the I/Q sample pair falls in the hashed region. For example, sector 6 is indicated if the outputs from comparators 520a through 520d are low, high, high, and low, respectively.

TABLE 1

| Comparator ⇒ | Comparator Outputs | | | | Decoder |
| --- | --- | --- | --- | --- | --- |
| Region⇒ | 520a | 520b | 520c | 520d | Output |
| Condition⇒ | A | B | C | D | Q[2:0] |
| | I > 0 | I > Q | −I > Q | Q > 0 | |
| Sector | | | | | |
| 1 | 1 | 1 | 0 | 1 | 000 |
| 2 | 1 | 0 | 0 | 1 | 001 |
| 3 | 0 | 0 | 0 | 1 | 010 |
| 4 | 0 | 0 | 1 | 1 | 011 |
| 5 | 0 | 0 | 1 | 0 | 100 |
| 6 | 0 | 1 | 1 | 0 | 101 |
| 7 | 1 | 1 | 1 | 0 | 110 |
| 8 | 1 | 1 | 0 | 0 | 111 |

For eight sectors, three bits Q0, Q1, and Q2 are used to identify a particular one of the sectors. Various mappings between the output data bits Q[2:0] and the sectors can be used. In one mapping, the decoder output is one less than the sector number. For example, sector 1 can be associated with Q[2:0]=000, sector 2 can be associated with Q[2:0]=001, and so on, as shown in the right most column of Table 1.

FIGS. 3 through 5 show a specific implementation of an 8-sector polar ADC. Generally, a polar ADC can be designed to quantize the I and Q signals to any number of sectors. This is achieved by comparing various combinations of scaled I signals (i.e., $\alpha_i I$) and scaled Q signals (i.e., $\beta_j I$), where the scaling coefficient $\alpha_i$ and $\beta_j$ are selected based on the particular polar ADC design. For the 8-sector polar ADC described above, the coefficients $\alpha_i$ and $\beta_j$ can each take on values of −1.0, 0.0, and 1.0 (e.g., $\alpha_i \in \{-1.0, 0.0, 1.0\}$ and $\beta_j \in \{-1.0, 0.0, 1.0\}$).

Figure 6:
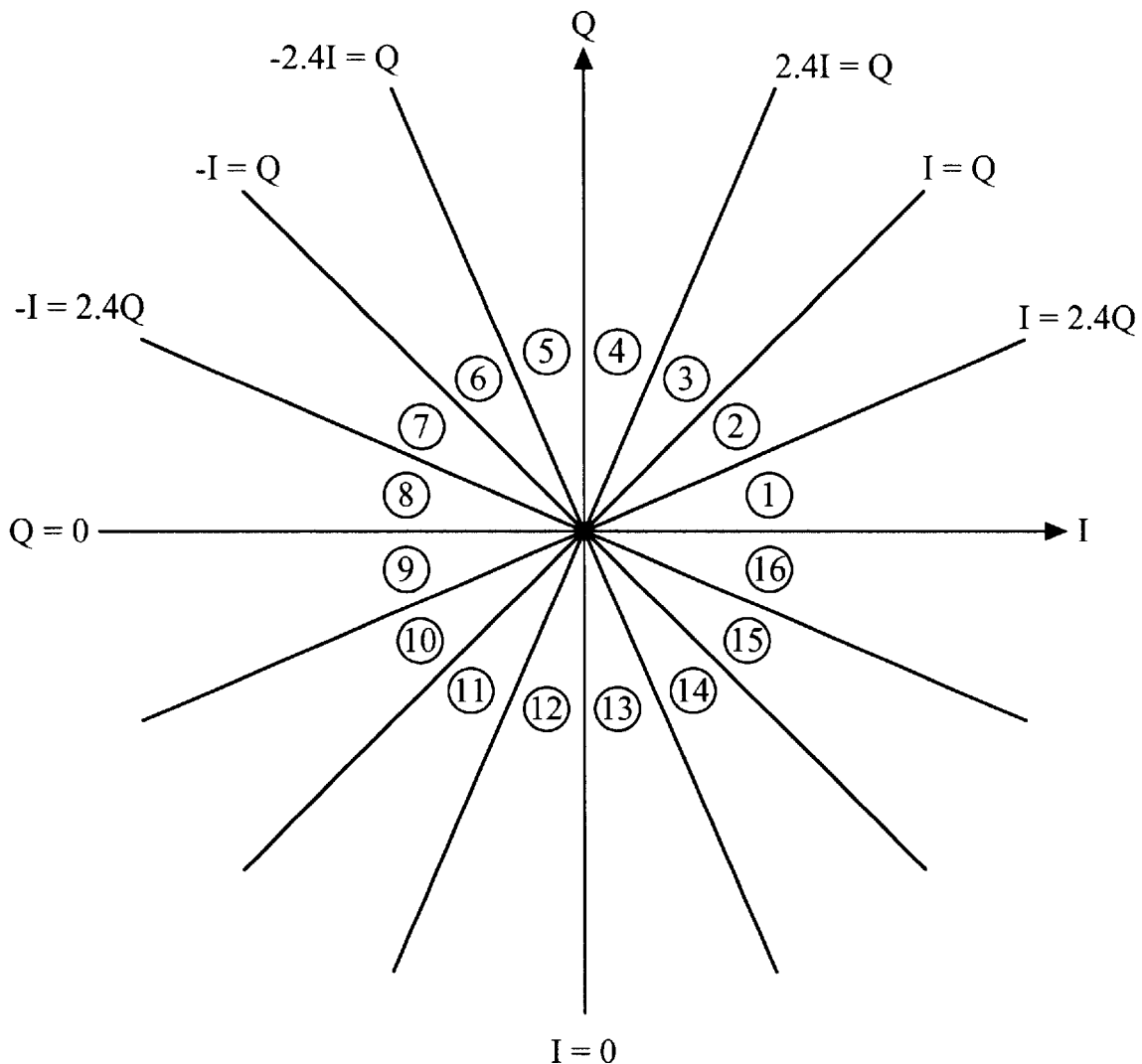
FIG. 6 shows a diagram of an I-Q plane for a 16-sector polar ADC.

FIG. 6 shows a diagram of an I-Q plane that is partitioned into 16 wedge-shaped sector. The sectors are generated by the intersection of eight lines, which are in turn defined by eight equations: I=0, Q=0, I=Q, −I=Q, 2.4I=Q, −2.4I=Q, I=2.4Q, and −I=2.4Q. The sectors are labeled with numerals 1 through 16, and each sector has 22.5° angle. For each I/Q sample pair, the polar ADC determines which one of the 16 sectors the sample pair falls into based on the results of the comparisons. The 16-sector polar ADC is able to resolve the angle of the I/Q sample pair to within ±11.25° of accuracy.

For the 16-sector polar ADC, the scaling coefficients $\alpha_i$ and $\beta_j$ can each take on values of −2.4, −1.0, 0.0, 1.0, and 2.4 (e.g., $\alpha_i$ and $\beta_j \in \{-2.4, -1.0, 0.0, 1.0, 2.4\}$). The value 2.4 is an approximation of the arc-tangent of 22.5°. To determine which one of the 16 sectors a particular I/Q sample pair falls in, the following eight comparisons are made: I>0, Q>0, I>Q, −I>Q, 2.4I>Q, −2.4I>Q, I>2.4Q, and −I>2.4Q.

Figure 7:
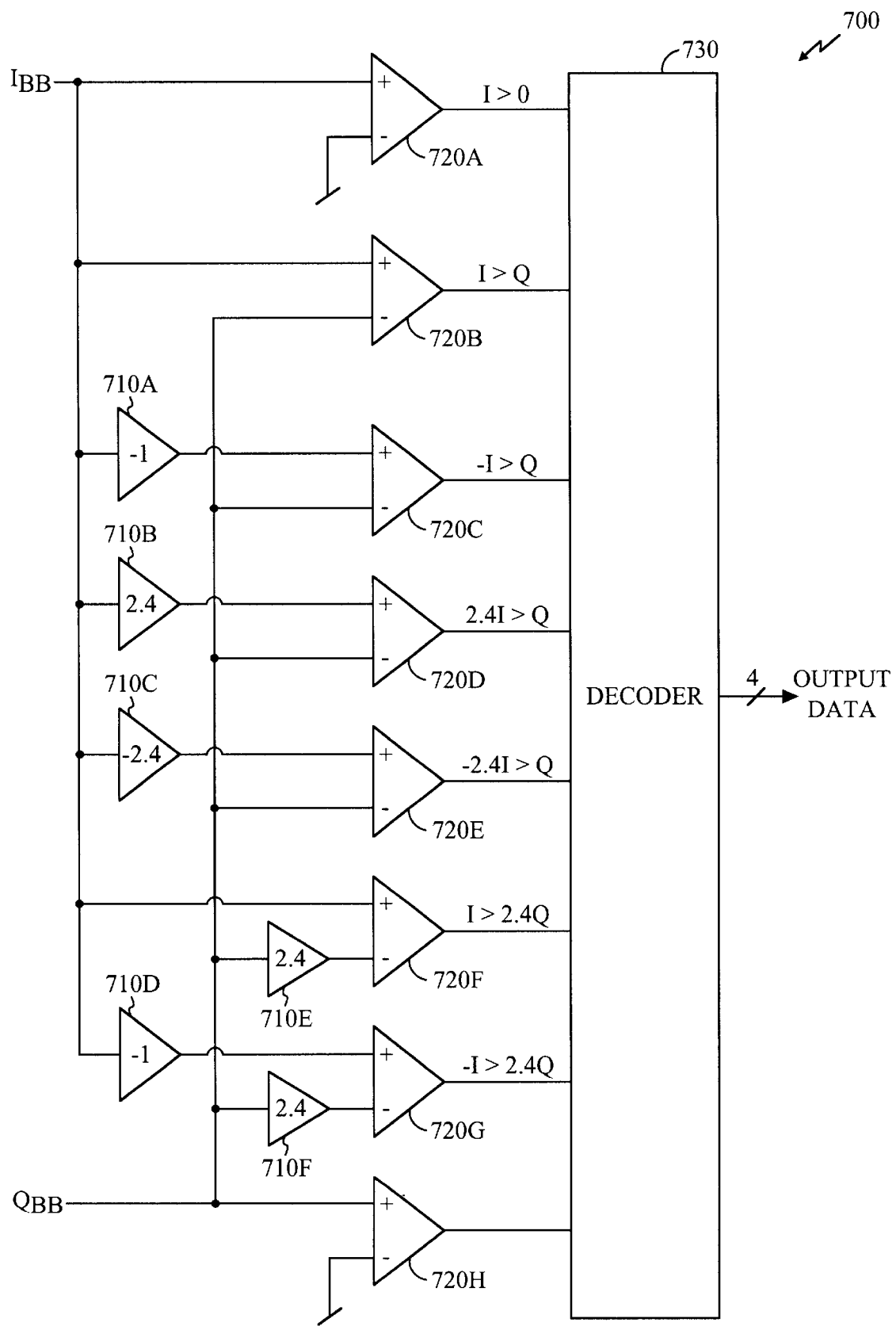
FIG. 7 shows a block diagram of an embodiment of a 16sector polar ADC.

FIG. 7 shows a block diagram of an embodiment of a 16-sector polar ADC 700. The I baseband ($I_{BB}$) signal is provided to the non-inverting inputs of comparators 720a, 720b, and 720f, and to the inputs of scaling elements 710a through 710d. The Q baseband ($Q_{BB}$) signal is provided to the inverting inputs of comparators 720b through 720e, the non-inverting input of a comparator 720h, and the inputs of scaling elements 710e and 710f. The inverting inputs of comparators 720a and 720h are coupled to a zero reference level. Scaling elements 710a through 710f scale the respective input signals with scaling factors of −1.0, 2.4, −2.4, −1.0, 2.4, and 2.4, respectively. Comparator 720a determines whether I>0, comparator 720b determines whether I>Q, comparator 720c determines whether −I>Q, comparator 720d determines whether 2.4I>Q, comparator 720e determines whether −2.4I>Q, comparator 720f determines whether I>2.4Q, comparator 720g determines whether −I>2.4Q, and comparator 720h determines whether Q>0. The outputs from comparators 720a through 720h comprise the intermediate data that is provided to a decoder 730. Decoder 730 determines the phase (or frequency) corresponding to each I/Q sample pair and provides the 4-bit output data.

Table 2 lists the 16 sectors in the I-Q plane and the associated outputs from comparators 720a through 720h. For example, sector seven is defined by the outputs from comparators 720a through 720h being low, low, low, low, high, low, low, and high, respectively. Again, various mappings can be used between the output data and the sector number. For example, the output from decoder 730 can be the sector number minus one (e.g., the output data for sector seven can be Q[3:0]=6).

TABLE 2

| | Comparator Outputs | | | | | | | |
|---|---|---|---|---|---|---|---|---|
| Sector | 720a I > 0 | 720b I > Q | 720c −I > Q | 720d 2.4I > Q | 720e −2.4I > Q | 720f I > 2.4Q | 720g −I > 2.4Q | 720h Q > 0 |
| 1 | 1 | 1 | 1 | 1 | 0 | 1 | 0 | 1 |
| 2 | 1 | 1 | 1 | 1 | 0 | 0 | 0 | 1 |
| 3 | 1 | 0 | 1 | 1 | 0 | 0 | 0 | 1 |
| 4 | 1 | 0 | 1 | 0 | 0 | 0 | 0 | 1 |
| 5 | 0 | 0 | 1 | 0 | 0 | 0 | 0 | 1 |
| 6 | 0 | 0 | 1 | 0 | 1 | 0 | 0 | 1 |
| 7 | 0 | 0 | 0 | 0 | 1 | 0 | 0 | 1 |
| 8 | 0 | 0 | 0 | 0 | 1 | 0 | 1 | 1 |
| 9 | 0 | 0 | 0 | 0 | 1 | 0 | 1 | 0 |
| 10 | 0 | 0 | 0 | 0 | 1 | 1 | 1 | 0 |
| 11 | 0 | 1 | 0 | 0 | 1 | 1 | 1 | 0 |
| 12 | 0 | 1 | 0 | 1 | 1 | 1 | 1 | 0 |
| 13 | 1 | 1 | 0 | 1 | 1 | 1 | 1 | 0 |
| 14 | 1 | 1 | 0 | 1 | 0 | 1 | 1 | 0 |
| 15 | 1 | 1 | 1 | 1 | 0 | 1 | 1 | 0 |
| 16 | 1 | 1 | 1 | 1 | 0 | 1 | 0 | 0 |

Various techniques can be used to generate the output data from the intermediate data. In an embodiment, the output data is determined by use of a $2^{N-1}$-bit input, N-bit output look-up table, where N is the number of bits of resolution of the polar ADC. For example, Table 2 for a 16-sector polar ADC in can be implemented with an 8-bit input, 4-bit output look-up table. However, it can be noted that Table 2 contains only a subset (i.e., 16) of the 256 possible entries for the 8-bit input. Thus, the look-up table for the polar ADC is relatively simple to implement. In contrast, for the conventional receiver design in FIG. 1A with each ADC having four bits of resolution, a look-up table for the phase information would have 256 entries. Table 2 can also be implemented using simple combinatory logic since many of the 256 possible entries in the table are "don't cares." As an example, Table 1 can be implemented by the following equations:

$$Q2 = \overline{A}B + A\overline{B} + CD + \overline{CD};$$

$$Q1 = \overline{A}D + A\overline{D};\ \text{and}$$

$$Q2 = \overline{D}. \qquad \text{Eqs. (1)}$$

Generally, the invention can be used to implement an M-sector polar ADC, where M can be any positive integer. When $M=2^N$, where N is the number of bits of resolution of the polar ADC, $2^{N-1}$ comparators are used to compare scaled I and Q signals that have been scaled by up to $2^{N-1}$ scaling coefficients.

The comparison operation is as follows:

$$\alpha_k I = \beta_k Q; \qquad \text{Eqs. (2)}$$

where $$\frac{\alpha_k}{\beta_k} = \tan\left(\frac{2\pi k}{2^N}\right), \text{ for } k = 0, 1, \ldots \text{ to } 2^{N-1} - 1.$$

However, of the $2^{N-1}$ scaling coefficients, only $2^{N-3}+1$ are "unique". For example, when M is 32, a 5-bit polar ADC can be implemented using 16 comparators that compare I and Q signals that are scaled by five unique coefficients (0.0, 1.0, 1.5, 2.4, and 5.0). This is because comparing $\infty \cdot I_{IN} > Q_{IN}$ is equivalent to comparing $I_{IN} > 0$, comparing $I_{IN}/2.4 > Q_{IN}$ is equivalent to comparing $I_{IN} > 2.4 \ Q_{IN}$, and so on. In some circuit designs, the I and Q signals are implemented with differential signals, and an inverted signal can be easily obtained by simply swapping the differential lines.

A $2^{N-1}$-bit input by N-bit output look-up table having $2^N$ entries can be used to receive the outputs from the $2^{N-1}$ comparators and provide the N-bit output data. Alternatively, combinatory logic can be used to generate the output data.

Figure 8:
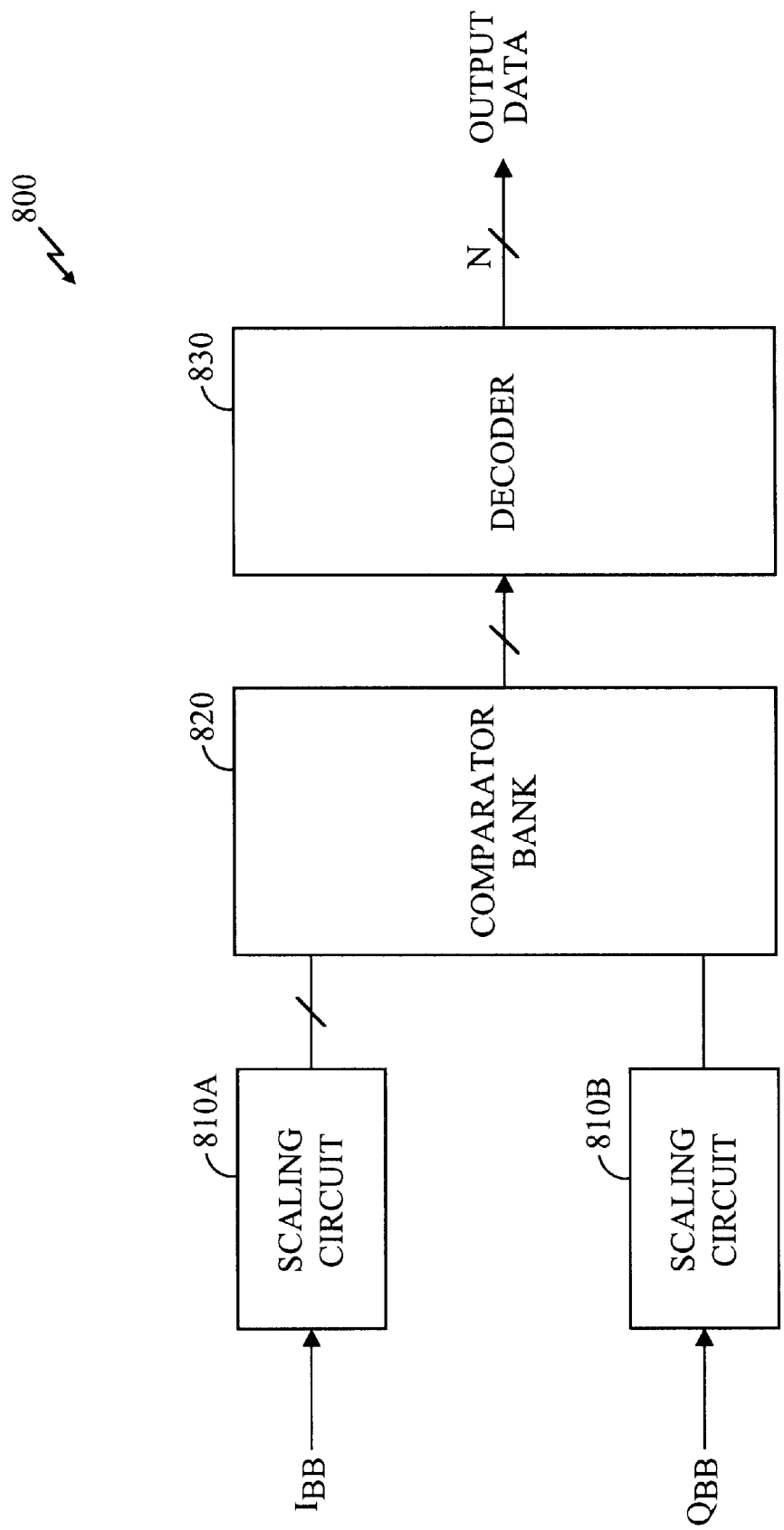
FIG. 8 shows a simplified block diagram of an embodiment of an M-sector polar ADC.

FIG. 8 shows a simplified block diagram of an embodiment of an M-sector polar ADC 800. The I baseband signal is provided to a scaling element 810a that generates a set of scaled I signals. Similarly, the Q baseband signal is provided to a scaling element 810b that generates a set of scaled Q signals. The scaled I and Q signals are provided to a comparator bank 820. Each comparator in comparator bank 820 compares a scaled I signal against a scaled Q signal (where the scaling factor can be 0.0). The outputs from the comparators are provided to a decoder 830 that determines the sector corresponding to the I/Q sample pair, extract the phase and/or frequency information, and provides the output data.

Scaling elements 810, comparator bank 820, and decoder 830 can be implemented in various manners. For example, scaling element 810 can be implemented using resistors, capacitors, amplifiers, and other circuit elements. The comparators can be implemented as voltage comparators in a manner known in the art. In an embodiment, for low cost, reduced power consumption, and high performance, these elements are implemented using a "current-mode" (as opposed to a "voltage-mode") implementation. In an embodiment, for the same reasons noted above, the elements are implemented using C-MOS circuits. An example of one C-MOS current design is described below.

Figure 9:
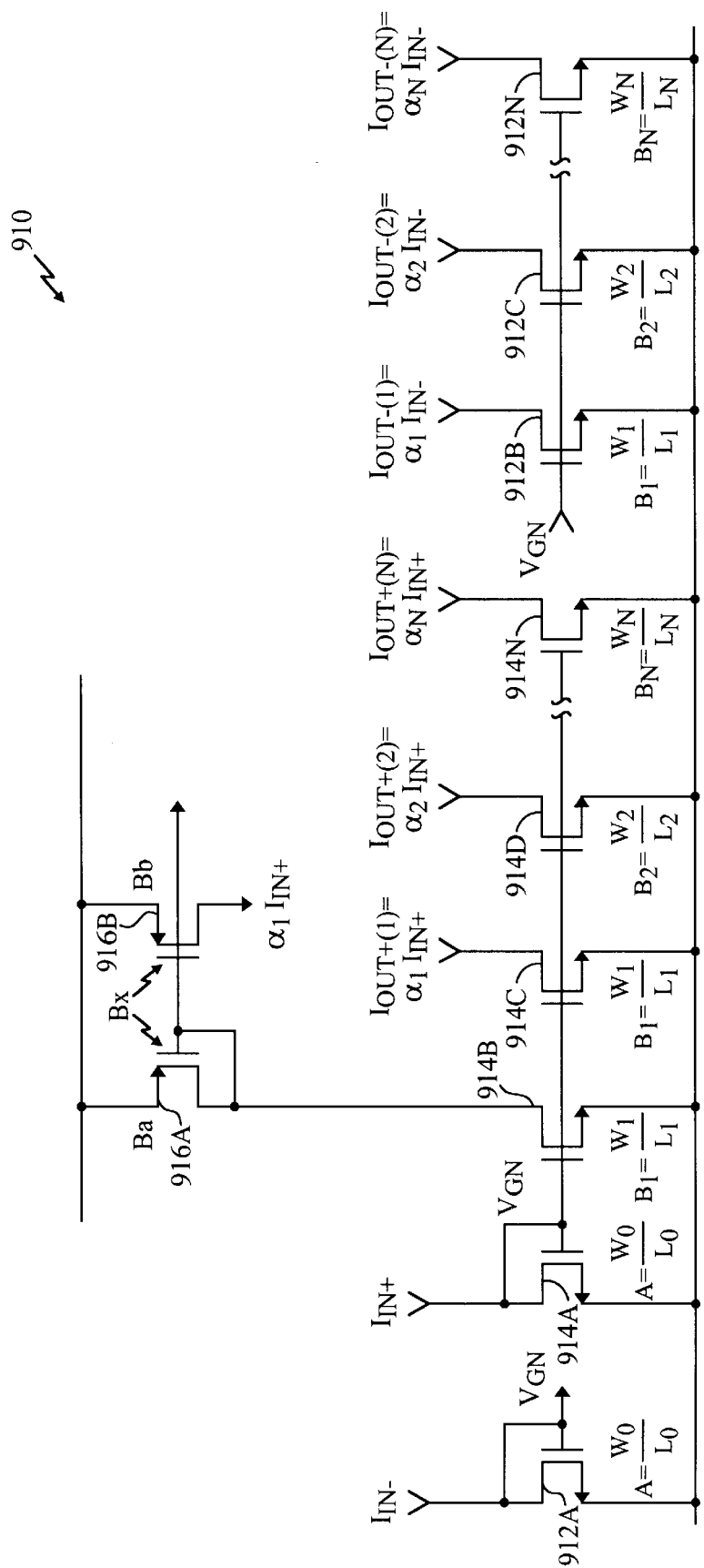
FIG. 9 shows a schematic diagram of an embodiment of a scaling element that can be used to implement each scaling element in FIG. 8.

FIG. 9 shows a schematic diagram of an embodiment of a scaling element 910 that can be used to implement each of scaling elements 810a and 810b in FIG. 8. In this embodiment, the I and Q baseband signals are each implemented with a differential current signal. The I baseband signal comprises $I_{IN+}$ and $I_{IN-}$ and the Q baseband signal comprises $Q_{IN+}$ and $Q_{IN-}$. If the I and Q signals are in voltage form, transconductance amplifiers can be used to convert the voltage signals into differential current signals. Such transconductance amplifiers are known in the art and not described herein.

The $I_{IN-}$ signal is provided to a reference path of a current mirror circuit 912 and the $I_{IN+}$ signal is provided to a reference path of a current mirror circuit 914. Current mirror circuit 914 comprises a set of N-channel transistors 914a through 914n coupled together at their gates. Transistor 914a forms the reference path and has its gate and drain coupled together. Transistors 914b through 914n form the mirror paths. Each of transistors 914b through 914n provides an output current $I_{OUT}$ that is a scaled version of the input current $I_{IN+}$ (i.e., $I_{OUT+}=\alpha_1 \cdot I_{IN+}$, where $\alpha_1$ is the scaling factor of the current in the mirror path relative to the current in the reference path). The scaling factor $\alpha_i$ is determined by the ratio of the W/L of the mirror transistor to the W/L of the reference transistor, where W and L are respectively the width and length of the transistor. For example, if $W_0$ and $L_0$ are the width and length of transistor 914a, and $W_2$ and $L_2$ are the width and length of transistor 914d, the output current from transistor 914d is $I_{OUT+(2)}=\alpha_2 \cdot I_{IN+}$, where $\alpha_2=B_2/A$, $B_2=W_2/L_2$ and $A=W_0/L_0$. The current mirrors have some implementation advantages. For example, is it easy to accurately set the width over length (W/L) ratio of the current mirrors to obtain accurate cc. Furthermore, implementation of current mirrors is very simple in an integrated circuit.

As shown in FIG. 9, transistors 914c through 914n provide "sinking" current. A "sourcing" current can be generated by use of a current mirror circuit coupled to the mirror path. For example, in FIG. 9, transistor 914b is dimensioned similar to transistor 914c to provide a sinking current of $\alpha_1 \cdot I_{IN+}$, which is then provided to a reference path of a current mirror circuit 916. Transistor 916a forms the reference path and has its gate coupled to its drain, and further to the gate of transistor 916b. If transistors 916a and 916b are similarly dimensioned, transistor 916b provides a sourcing current of $\alpha_1 \cdot I_{IN+}$. Additional transistors can be coupled parallel to transistor 916b and appropriately dimensioned to provide other sourcing currents (i.e., $\alpha_2 \cdot I_{IN+}$ through $\alpha_N \cdot I_{IN+}$.

Although not shown in FIG. 9 for simplicity, similar circuitry is used to receive the complementary signal $I_{IN-}$ and generate scaled $I_{IN-}$ signals. Circuitry is also used to receive the $Q_{IN+}$ and $Q_{IN-}$ signal and generate scaled $Q_{IN+}$ and $Q_{IN-}$ signals. The use of differential signal is advantageous because of improved performance including higher speed of operation, improved noise immunity, lower supply voltage requirement, and others.

Figure 10A:
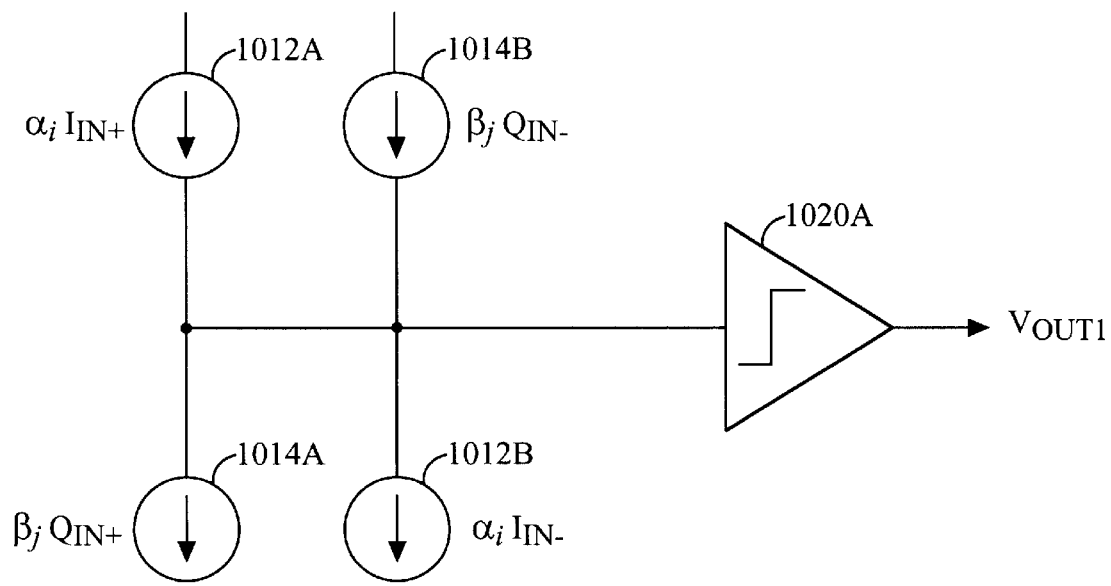
FIGS. 10A and 10B show diagrams of two comparator circuits configured to evaluate the functions $(\alpha_i \cdot I_{IN} - \beta_j \cdot Q_{IN})$ and $(\alpha_i \cdot I_{IN} + \beta_j \cdot Q_{IN})$, respectively.

FIG. 10A shows a diagram of an embodiment of a current comparator 1020a that can be used to implement each comparator in comparator bank 920. Comparator 1020a in FIG. 10A evaluates the function $(\alpha_1 \cdot I_{IN-}\beta_j \cdot Q_{IN})$, or effectively compares $\alpha \cdot I_{IN}$ with $\beta_j \cdot Q_{IN}$. Comparator 1020a receives a differential scaled $I_{IN}$ signal (i.e., $\alpha_i \cdot I_{IN+}$ and $\alpha_i \cdot I_{IN-}$, which is represented by current sources 1012a and 1012b, respectively) and a differential scaled $Q_{IN}$ signal (i.e., $\beta_j \cdot Q_{IN+}$ and $\beta_j \cdot Q_{IN-}$, which is represented by current sources 1014a and 1014b, respectively). In actual circuit implementation, current sources 1012a and 1014b are transistors in the sourcing current mirror paths (e.g., transistor 916b in FIG. 9) and current sources 1012b and 1014a are transistors in the sinking current mirror paths (e.g., transistor 914c in FIG. 9).

Since the signals are current signals, they can be combined at the input of comparator 1020a by simply coupling the current sources together. The net current ($I_{TOT}$) flowing into the input of current comparator 1020a can be computed as:

$$I_{TOT}=\alpha_i(I_{IN+}-I_{IN-})-\beta_j(Q_{IN+}-Q_{IN-})=\alpha_i \cdot I_{IN}-\beta_j \cdot Q_{IN}. \quad \text{Eq. (3)}$$

The output from comparator 1020a is defined as:

$$V_{OUT} = \begin{cases} \text{``1''} & \text{if } I_{TOT} > 0 \text{ or } \alpha_i \cdot I_{IN} > \beta_j \cdot Q_{IN} \\ \text{``0''} & \text{if } I_{TOT} < 0 \text{ or } \alpha_i \cdot I_{IN} < \beta_j \cdot Q_{IN}. \end{cases} \quad \text{Eq. (4)}$$

Figure 10B:
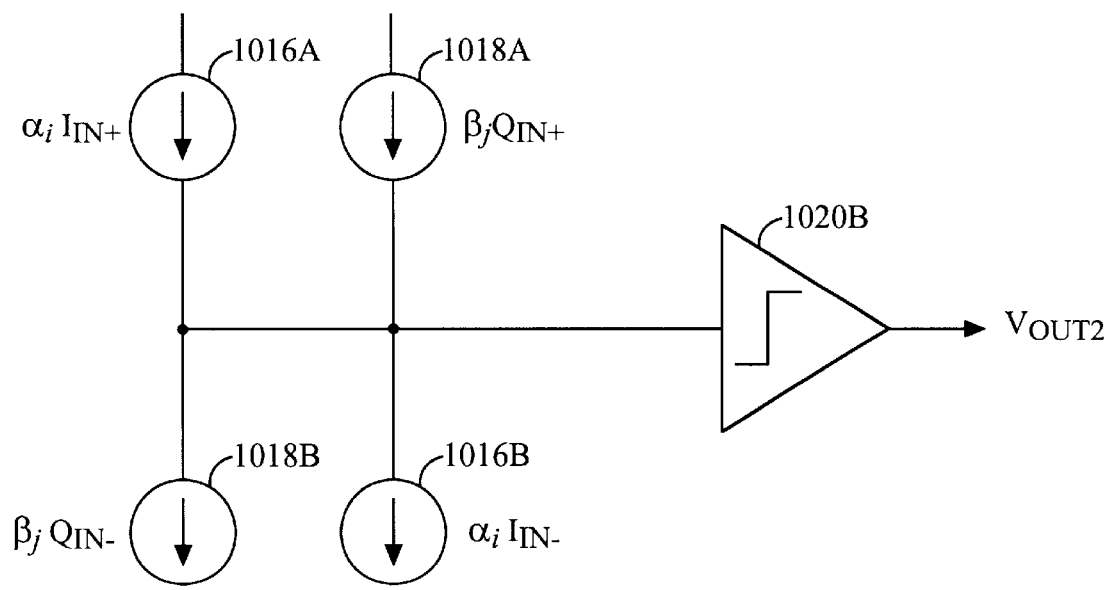

FIG. 10B shows a diagram of a comparator 1020b configured to evaluate the function $(\alpha_i \cdot I_{IN}+Q_{IN})$, or effectively compares $-_i \cdot I_{IN}$ with $\beta_j \cdot I_{IN}$. As shown in FIG. 10B, comparator 1020b receives a differential scaled $I_{IN}$ signal (i.e., $\alpha_i \cdot I_{IN+}$ and $\alpha_i \cdot I_{IN-}$, which is represented by current sources 1016a and 1016b, respectively) and a differential scaled $Q_{IN}$ signal (i.e., $\beta_j \cdot I_{IN+}$ and $\beta_j \cdot I_{IN-}$, which is represented by current sources 1018a and 1018b, respectively). The net current ($I_{TOT}$) flowing into the input of current comparator 1020b can be computed as:

$$I_{TOT} = \alpha_i \cdot I_{IN} + \beta_j \cdot Q_{IN}, \qquad \text{Eq. (5)}$$

and the output from comparator 1020b is defined as:

$$V_{OUT} = \begin{cases} \text{``1''} & \text{if } I_{TOT} > 0 \text{ or } -\alpha_i \cdot I_{IN} > \beta_j \cdot Q_{IN} \\ \text{``0''} & \text{if } I_{TOT} < 0 \text{ or } -\alpha_i \cdot I_{IN} < \beta_j \cdot Q_{IN}. \end{cases} \qquad \text{Eq. (6)}$$

Comparator 1020b can be implemented in a manner described in a paper by H. Träff, entitled "A Novel Approach to CMOS Comparators", Electronics Letters, $30^{th}$ January 1992, Vol. 28, No. 3, pp. 310–312.

Figure 11A:
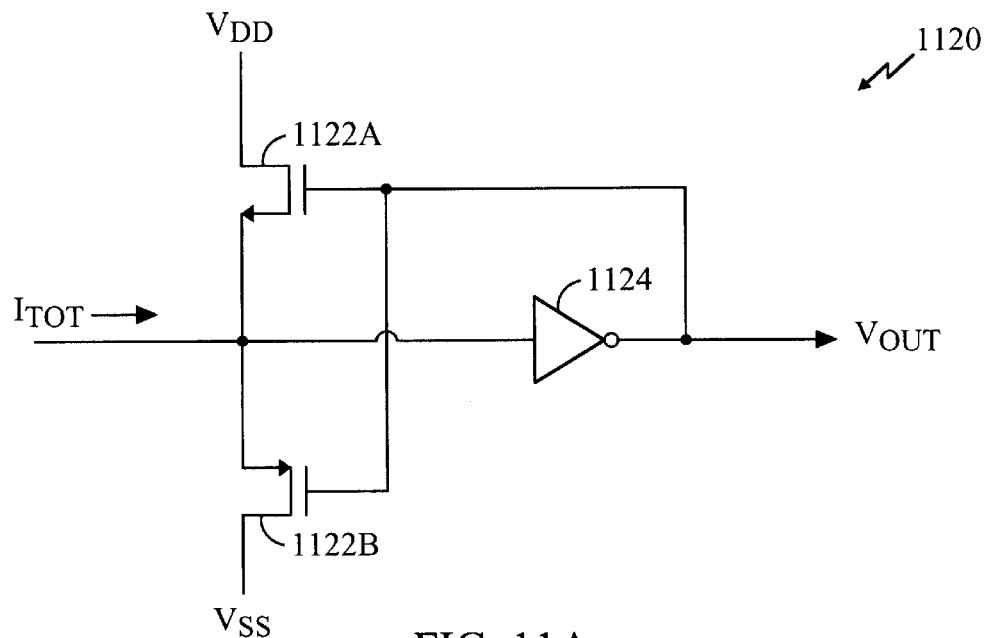
FIG. 11A shows a schematic diagram of a current comparator that can be used for the comparators in FIGS. 10A and 10B.

FIG. 11A shows a schematic diagram of a current comparator 1120 that can be used for comparators 1020a and 1020b in FIGS. 10A and 10B. Comparator 1120 is described in the aforementioned paper by H. Träff and includes an N-channel transistor 1122a coupled in series with a P-channel transistor 1122b. The sources of transistors 1122a and 1122b couple together, the gates of transistors 1122a and 1122b couple together, the drain of transistor 1122a couples to a positive supply $V_{DD}$, and the drain of transistor 1122b couples to a negative supply $V_{SS}$. The sources of transistors 1122a and 1122b further couple to the input of an inverter 1124 and the output of inverter 1124 couples to the gates of the transistors.

Comparator 1120 operates in the following manner. When the input current $I_{TOT}$ is positive (i.e., flowing into comparator 1120), transistor 1122b turns on to sink the input current, transistor 1122a turns off, and the output voltage of inverter 1124 is defined as:

$$V_{OUT} = V_{TRIP} - V_{GS(P)}, \qquad \text{Eq. (7)}$$

where $V_{TRIP}$ is the input trip voltage (i.e., the voltage at the input of inverter 1124), and $V_{GS(P)}$ is the gate-to-source voltage of P-channel transistor 1122b. In a complementary manner, when the input current $I_{TOT}$ is negative (i.e., flowing from comparator 1120), transistor 1122a turns on to provide the sourcing current, transistor 1122b turns off, and the output voltage of inverter 1124 is defined as:

$$V_{OUT} = V_{TRIP} + V_{GS(N)}, \qquad \text{Eq. (8)}$$

where $V_{GS(N)}$ is the gate-to-source voltage of N-channel transistor 1122a. The voltage at the input of comparator 1120 is maintained at approximately $V_{TRIP}$ for both cases, which provides the comparator with a near virtual ground input. Comparator 1120 is capable of operating at high speed and low power, which are both highly desirable in many modern day electronics circuits.

Figure 11B:
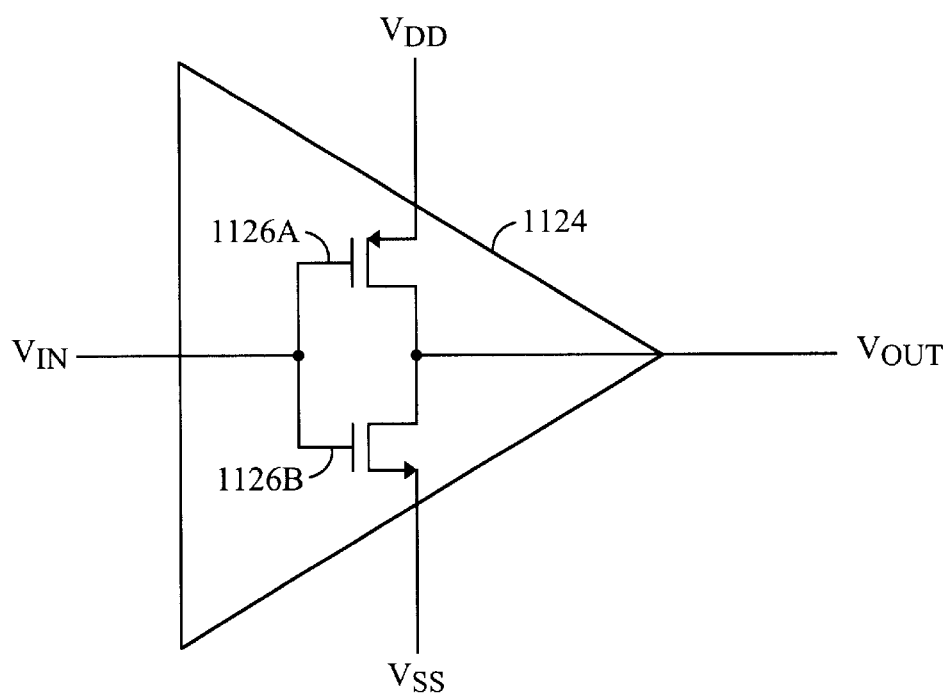
FIG. 11B shows a schematic diagram of an embodiment of an inverter.

FIG. 11B shows a schematic diagram of a design of inverter 1124. Inverter 1124 includes an N-channel transistor 1126a coupled in series with a P-channel transistor 1126b. The gates of transistors 1126a and 1126b couple together and form the inverter input, and the drains of transistors 1126a and 1126b couple together and form the inverter output.

The polar ADC of the invention can be specially designed for the application for which it is used. For applications that do not require a high degree of accuracy (i.e., a large number of sectors), a reduced number of comparators and scaled signals can be used. Simplified polar ADCs can be designed to provide the functionality and performance required by the specific applications, some of which are described below.

Figure 12A:
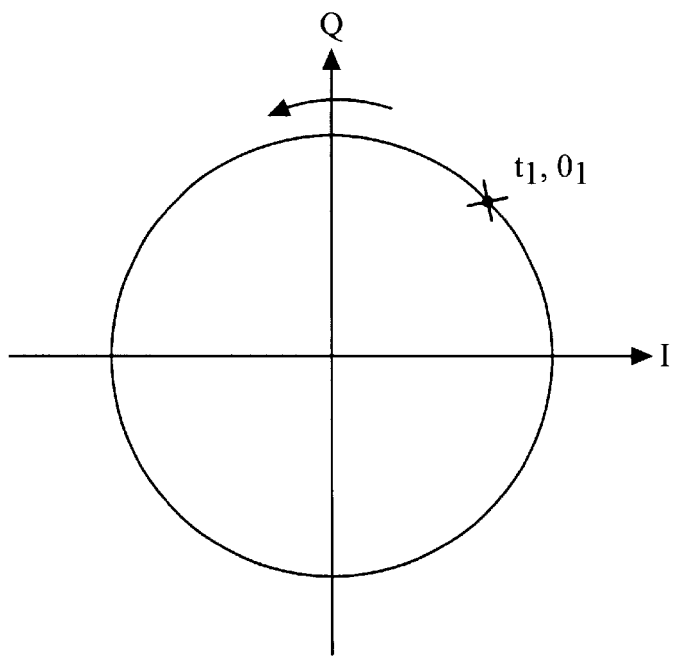
FIG. 12A shows a diagram of an I-Q plane for a simple FM system.

FIG. 12A shows a diagram of an I-Q plane for a simple FM system. As noted above, a polar ADC can be used to extract frequency as well as phase information. Frequency can be determined by differentiating phase. In a lossless system, at any moment in time, the modulated signal can be viewed as being located on a unit circle and having a particular phase. Data is transmitted in the instantaneous frequency of a carrier signal, which can be detected by the change in the phase of the carrier. For a simple FM system (e.g., a paging system), at the receiver, it may only be necessary to detect the change in the phase of the current sample relative to that of the preceding sample. As shown in FIG. 12A, the modulated signal has a phase of $\phi_1$ at sample time $t_1$. In the FM system, it may only be necessary to determine whether the phase at the next sample time $t_2$ crosses over the Q axis (i.e., the I=0 line). Similarly, for other samples, it may only be necessary to determine whether the phase crosses over the I axis (i.e., the Q=0 line) or the Q axis.

Figure 12B:
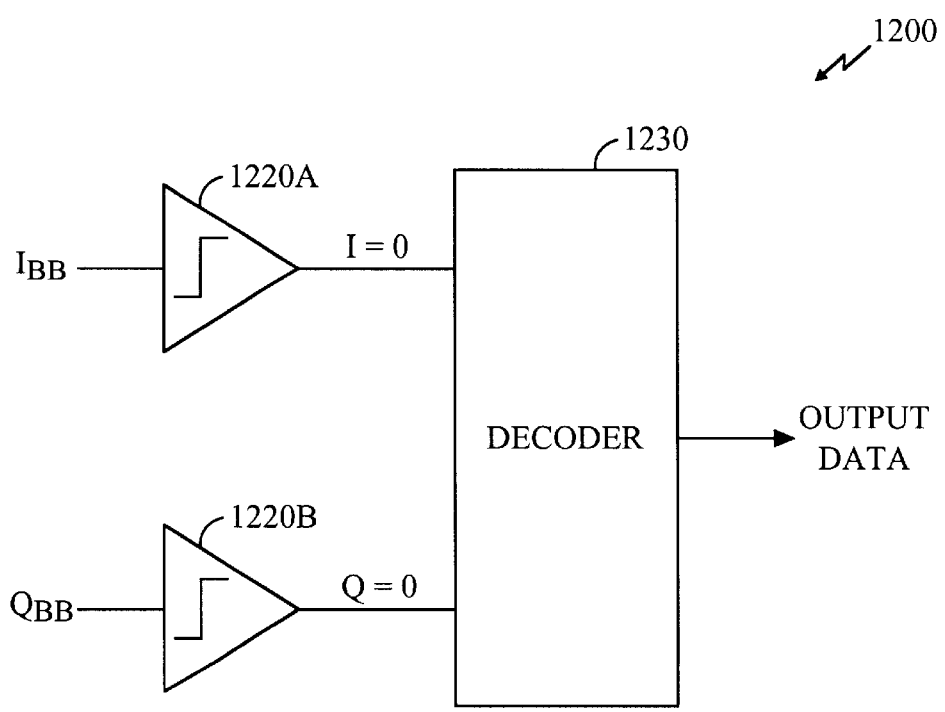
FIG. 12B shows a diagram of a demodulation unit that can be used for the simple FM system.

FIG. 12B shows a diagram of a demodulation unit 1200 that can be used for the FM system described above with reference to FIG. 12A. The I and Q baseband signals are provided to a pair of comparators 1220a and 1220b, respectively. Since only zero crossings are being detected, each comparator 1220 receives only one of the baseband signals. Comparator 1220a detects whether the I baseband signal is greater or less than zero, and comparator 1220b detects whether the Q baseband signal is greater or less than zero. The outputs from comparators 1220a and 1220b are provided to a decoder 1230 that generates the output data. Decoder 1230 performs the decoding complementary to that at the transmitter. For example, in an FM system in which the amount of phase change in the modulated signal is dependent on the value of the modulating data, decoder 1230 compares the phase of the current I/Q sample pair with the phase of the immediately preceding current I/Q sample pair.

Figure 13A:
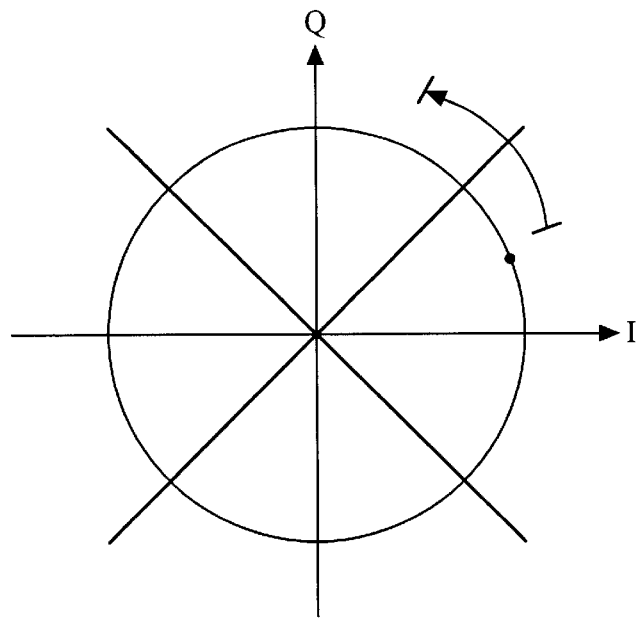
FIG. 13A shows a diagram of an I-Q plane for a narrow-band FM system.

FIG. 13A shows a diagram of an I-Q plane for a narrow-band FM system. In narrow-band FM modulation, the amount of phase rotation per unit time (i.e., between successive samples) is smaller. As a result, higher resolution in the polar ADC is required to perform demodulation. Generally, more segments are needed for more narrow band FM systems.

Figure 13B:
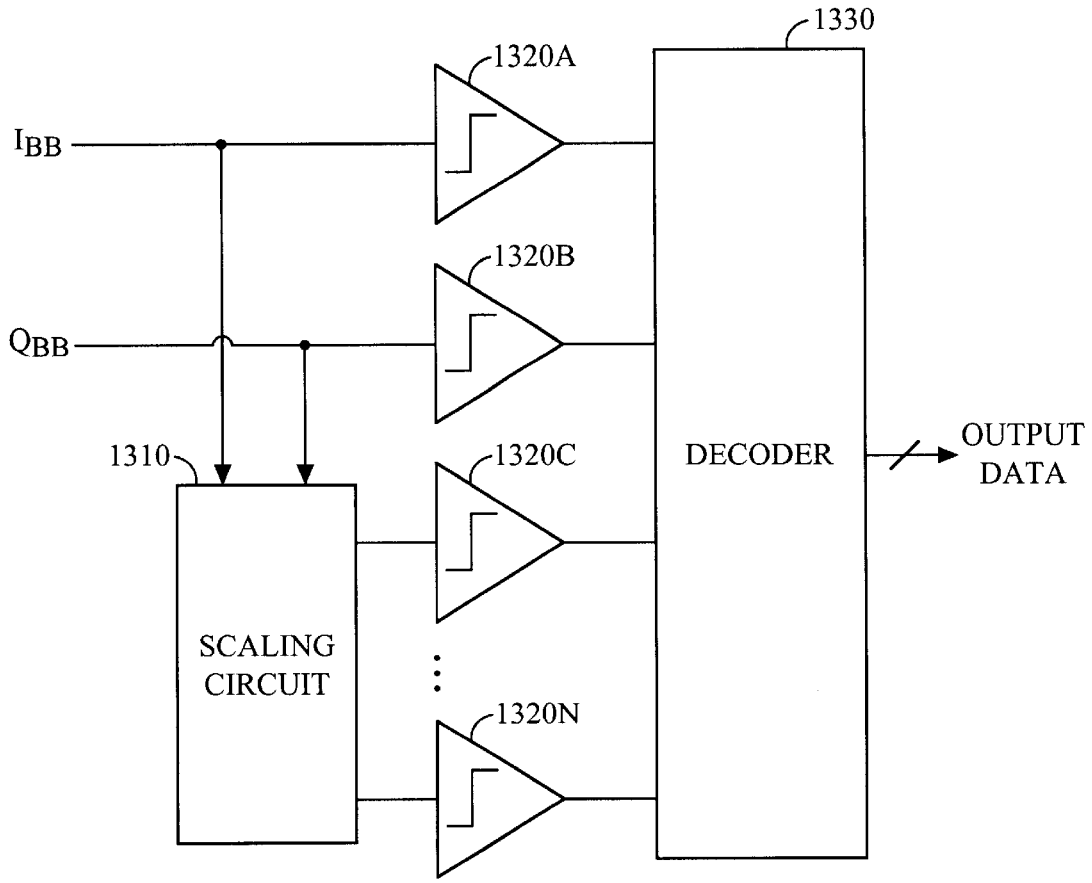
FIG. 13B shows a diagram of a demodulation unit that can be used for the narrow-band FM system.

FIG. 13B shows a diagram of a demodulation unit 1300 that can be used for a narrow-band FM system. The I and Q baseband signals are provided to a pair of comparators 1320a and 1320b, respectively, that detect zero crossings. The I and Q baseband signals are also provided to a scaling element 1310 that generate sets of scaled I and Q signals. For example, for a uniformly divided 8-sector polar ADC, scaling element 1310 generates a set of $I_{BB}$ and $Q_{BB}$ signals and a set of $-I_{BB}$ and $Q_{BB}$ signals. For higher order polar ADCs, scaling element 1310 generates additional sets of scaled I and Q signals. Each set of scaled I and Q signals is combined and provided to a respective comparator 1320. The outputs from the comparators are provided to a decoder 1330 that performs the phase or frequency decoding. For frequency decoding, the amount of phase rotation between successive pairs of samples is used to determine the modulating frequency, which is then used to determine the modulating data. The amount of phase rotation can be averaged over multiple I/Q sample pairs to obtain higher accuracy.

The techniques described above to construct the polar ADC can also be used to construct a "radial" ADC. In many communication systems, extremely accurate amplitude information is not required, which lessens the requirements on the radial ADC. In fact, for some simple receiver systems, amplitude information is not needed at all. More sophisticated systems often use a received signal strength indicator (RSSI), which provides a coarse indication of the received signal amplitude. These types of receivers often also incorporate automatic gain control (AGC), which may be implemented using variable gain amplifiers (VGAs) in the signal path and a control circuit, which measures the receiver output signal. This AGC function also inherently provides the radial ADC, since the amplitude value can simply be determined from the gain setting of the VGAs. This is especially true when the VGAs are programmable gain amplifiers (PGAs), where the gain is set by a digital word.

As is well known in the art, the amplitude of a signal can be computed as:

$$\text{Ampl} = \sqrt{I_{BB}^2 + Q_{BB}^2}. \qquad \text{Eq. (9)}$$

For an implementation in hardware, the squaring and the square root functions can be performed using the exponential function of a bipolar transistor or a square function of a MOS transistor. One or more comparators are then used to quantize the signal amplitude.

The auxiliary circuits described above (e.g., the RSSI and the AGC) can be easily designed to provide amplitude information to supplement the phase information provided by the polar ADC. For some receiver design, the amplitude information may be obtained from a means (e.g., the AGC) that is an inherent part of the receiver. Thus, even when coarse amplitude information is desired in addition to phase, the combination of the polar ADC with amplitude quantization circuitry may be a more desirable solution than using separate I and Q ADCs followed by digital calculation of amplitude and phase.

The polar ADC of the invention can be used for various applications, including communications and data transmissions. Additional applications of the polar ADC can be contemplated and are within the scope of the present invention.

The polar ADC of the invention provides numerous advantages over conventional ADCs for applications requiring phase and/or frequency detection. Some of these advantages are highlighted below.

First, a polar ADC compares scaled versions of the I and Q signals. This results in a phase determination system that is less prone to amplitude mismatch in the I and Q signal paths. In conventional designs that use two ADCs to independently sample and quantize the I and Q signals, amplitude mismatch between the two ADCs translates to an error in the computed angle. With the polar ADC, comparators are used to compare sets of scaled I and Q signals. As described above, the scaling of the I and Q signals can be achieved using current mirror circuits, which can be designed to provide a high degree of scaling accuracy. The accuracy of the current mirrors is typically better than one percent (<1%), and depends on the process, biasing, and die area. Errors in the scaling of the I and Q signals can further be minimized or reduced by following good design and layout practices known in the art, e.g. cascoding and common-centroid layout with dummy-devices.

Second, only one polar ADC is needed to extract phase and/or frequency information whereas two ADCs are needed to sample and quantize the I and Q signals in convention designs. Moreover, an N-bit polar ADC designed to quantize to one of M sectors, where $M<2^N$, uses up to $2^{N-1}$ comparators whereas each conventional (flash) ADC uses $2^N$ comparators, or approximately twice as many comparators. A significant reduction in the number of comparators (by up to a factor of four) is possible in designs using a polar ADC.

Third, a polar ADC typically requires less support circuitry than conventional ADCs. For example, unlike conventional ADCs, a polar ADC does not require accurate reference voltages, divider ladders, and so on, since only scaled versions of the I and Q signals are compared. Thus, the polar ADC can typically be more simply and efficiently implemented than a conventional ADC. Using current mirrors and inverters, each comparator in the polar ADC can be implemented using as few as six transistors, four transistors for the four current sources in FIG. 10A and two transistors for current comparator 1020a.

Fourth, the phase of each I/Q sample pair can be determined from the outputs of the comparators, without the need for complex hardware or software to compute the phase angle. A $2^{N-1}$ bit input, N-bit output look-up table having $2^N$ entries can be used to receive the outputs from the $2^{N-1}$ comparators and provide the N-bit output data. Alternatively, combinatory logic can be used to generate the output data. In a conventional two-ADC design, the look-up table typically includes $2^{2^{N-1}}$ entries, which is a much larger table as N increases.

Fifth, a polar ADC can provide more accurate phase information, especially at small signal amplitude. Referring back to FIG. 3, the M sectors are wedge shaped and connected at the center of the I-Q plane. Therefore, when the I and Q signals fall near the center of the I-Q plane, higher resolution is needed to resolve phase. However, since most conventional ADCs are designed with uniform step sizes and quantization of the signal amplitude is performed prior to the phase determination, the quantized I/Q sample pair is relatively coarse near the center of the I-Q plane and phase accuracy is compromised. In contrast, with the polar ADC, the I and Q signals are (typically) scaled and compared prior to quantization, thus providing improved accuracy in the detected phase.

Sixth, a polar ADC is suitable for implementation in complementary metal-oxide semiconductor (C-MOS) process, which is preferred for many applications because of its low cost, high speed of operation, and reduced power consumption. One such C-MOS design is described above. However, the polar ADC can also be implemented in other processes including bipolar junction transistor (BJT), field effect transistor, (FETs), MOSFETs, MESFETs, HBTs, P-HEMTs, GaAs, and others, or a combination of the above processes (e.g., bi-CMOS).

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A single analog-to-digital converter (ADC) for extracting at least one of phase and frequency information between two signals comprising:
   a first scaling element configured to receive and scale a first signal to provide a set of one or more scaled first signals;
   a second scaling element configured to receive and scale a second signal to provide a set of one or more scaled second signals;

a plurality of comparators coupled to the first and second scaling elements, each comparator configured to receive and compare a respective pair of scaled first and second signals and provide a comparison output; and a decoder coupled to the plurality of comparators, the decoder configured to receive comparison outputs from the plurality of comparators and generate output data.

2. The ADC of claim 1, wherein each scaling element includes a first current mirror circuit configured to receive an input signal via a reference path of the first current mirror circuit and to provide one or more scaled signals via a first set of mirror paths, wherein the input signal corresponds to either the first or second signal.

3. The ADC of claim 2, wherein each scaling element further includes a second current mirror circuit configured to receive a complementary input signal via a reference path of the second current mirror circuit and to provide one or more scaled signals via a second set of mirror paths.

4. The ADC of claim 3, wherein each scaling element further includes a third current mirror circuit configured to receive, via a reference path of the third current mirror circuit, a scaled signal from one mirror path of the first current mirror circuit and to provide one or more scaled signals via a third set of mirror paths, and a fourth current mirror circuit configured to receive, via a reference path of the fourth current mirror circuit, a scaled signal from one mirror path of the second current mirror circuit and to provide one or more scaled signals via a fourth set of mirror paths.

5. The ADC of claim 1, wherein each comparator comprises a current comparator configured to receive a respective input current signal generated by combining current signals corresponding to selected ones of the scaled first and second signals.

6. The ADC of claim 5, wherein each current comparator comprises first and second transistors coupled together at their sources and their bases, and an inverter having an input coupled to the sources of the transistors and an output coupled to the gates of the transistors.

7. The ADC of claim 1, wherein the decoder is implemented with a look-up table.

8. The ADC of claim 1, wherein the decoder is implemented with combinatory logic.

9. The ADC of claim 1, wherein the first and second scaling elements and the plurality of comparators are implemented with C-MOS circuits.

10. The ADC of claim 1, wherein the first and second scaling elements and the plurality of comparators are configured to operate on differential signals.

11. The ADC of claim 1, wherein the first and second scaling elements, the plurality of comparators, and the decoder are configured to provide four or more bits of resolution.

12. The ADC claim 1, wherein the first and second signals are scaled with scaling coefficients $\alpha_k$ and $\beta_k$, respectively, where $$\frac{\alpha_k}{\beta_k} = \tan\left(\frac{2\pi k}{2^N}\right), \text{ for } k = 0, 1, \ldots \text{ to } 2^{N-1} - 1,$$

and N is the number of bits of the output data.

13. The ADC of claim 1, wherein the output data is indicative of a phase of the first and second signals.

14. The ADC of claim 1, wherein the output data is indicative of a frequency of the first and second signals.

15. The ADC of claim 14, wherein frequency determination is performed by comparing phases of successive samples of the first and second signals.

16. A quadrature demodulator comprising the ADC of claim 1, wherein the first and second signals correspond to inphase and quadrature signals.

17. A single analog-to-digital converter (ADC) for extracting at least one of phase and frequency information between two signals, the ADC having N bits of resolution and comprising:

a first scaling element configured to receive and scale a first signal to provide a set of up to $2^{N-1}$ scaled first signals;

a second scaling element configured to receive and scale a second signal to provide a set of up to $2^{N-1}$ scaled second signals;

a plurality of $2^{N-1}$ comparators coupled to the first and second scaling elements, each comparator configured to receive a respective pair of scaled first and second signals and provide a comparison output, wherein the $2^{N-1}$ comparators implement comparison tests for $2^{N-1}$ lines in an I-Q plane intersecting at a common point; and a decoder coupled to the $2^{N-1}$ comparators, the decoder configured to receive comparison outputs from the $2^{N-1}$ comparators and generate N-bit output data.

18. The ADC of claim 17, wherein the $2^{N-1}$ lines define $2^N$ sectors having equal angles.

19. A receiver comprising:

a front end unit configured to receive a modulated signal and provide an intermediate signal;

a demodulator coupled to the front end unit, the demodulator configured to receive and demodulate the intermediate signal with a set of inphase and quadrature carrier signals to generate demodulated inphase and quadrature signals; and a single analog-to-digital converter (ADC) coupled to the demodulator, the ADC configured to extract at least one of phase and frequency information between the demodulated inphase and quadrature signals and generate output data.

20. The receiver of claim 19, wherein the ADC includes:

a first scaling element configured to receive and scale the demodulated inphase signal to provide a set of one or more scaled inphase signals;

a second scaling element configured to receive and scale the demodulated quadrature signal to provide a set of one or more scaled quadrature signals;

a plurality of comparators coupled to the first and second scaling elements, each comparator configured to receive and compare a respective pair of scaled inphase and quadrature signals and provide a comparison output; and a decoder coupled to the plurality of comparators, the decoder configured to receive comparison outputs from the plurality of comparators and generate the output data.

21. The receiver of claim 19, wherein the ADC is configured to perform phase demodulation of the modulated signal.

22. The receiver of claim 19, wherein the ADC is configured to perform frequency demodulation of the modulated signal.

23. The receiver of claim 19, further comprising:
  a first filter coupled between the demodulator and the ADC, the first filter configured to receive the demodulated inphase signal and provide a filtered inphase signal to the ADC; and
  a second filter coupled between the demodulator and the ADC, the second filter configured to receive the demodulated quadrature signal and provide a filtered quadrature signal to the ADC.

24. A FM demodulator comprising the receiver of claim 19.

25. A method of obtaining at least one of phase and frequency information between two signals using a single ADC, the method comprising:
  receiving a first signal and a second signal;
  scaling the first signal with one or more scaling coefficients to generate a set of scaled first signals;
  scaling the second signal with one or more scaling coefficients to generate a set of scaled second signals;
  generating pairs of scaled first and second signals;
  comparing the scaled first and second signals in each generated pair to provide a comparison result; and
  decoding the comparison results from the comparing to generate output data.

26. The method of claim 25, wherein the one or more scaling coefficients are selected to provide $2^N$ equal size wedge-shaped sectors, where N is the number of bits of the output data.

27. The method of claim 25, wherein the one or more scaling coefficients for the first signal are represented as $\alpha_k$ and the one or more scaling coefficients for the second signal are represented as $\beta_k$, where $$\frac{\alpha_k}{\beta_k} = \tan\left(\frac{2\pi k}{2^N}\right), \text{ for } k = 0, 1, \ldots \text{ to } 2^{N-1} - 1,$$

and N is the number of bits of the output data.

* * * * *